US006452855B1

(12) United States Patent
Hsu et al.

(10) Patent No.: US 6,452,855 B1
(45) Date of Patent: Sep. 17, 2002

(54) DRAM ARRAY INTERCHANGEABLE BETWEEN SINGLE-CELL AND TWIN-CELL ARRAY OPERATION

(75) Inventors: Louis L. Hsu, Fishkill, NY (US); Rajiv V. Joshi, Yorktown Heights, NY (US); John A. Fifield, Underhill, VT (US); Wayne F. Ellis, Jericho, VT (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/755,868

(22) Filed: Jan. 5, 2001

(51) Int. Cl.[7] .............................................. H01L 27/118
(52) U.S. Cl. ........................ 365/230.03; 365/230.01; 365/189.01; 365/189.08
(58) Field of Search ...................... 365/230.01, 230.03, 365/230.06, 189.01, 189.08

(56) References Cited

U.S. PATENT DOCUMENTS 5,982,680 A * 11/1999 Wada ......................... 365/200

6,201,757 B1 * 3/2001 Ward et al. ............ 365/230.05

FOREIGN PATENT DOCUMENTS

| JP | 403142790 A | * | 6/1991 |
| JP | 403238872 A | * | 10/1991 |
| JP | 407249747 A | * | 9/1995 |
| JP | 410322913 A | * | 12/1998 |
| JP | 411134877 A | * | 5/1999 |

* cited by examiner

Primary Examiner—Viet Q. Nguyen
(74) Attorney, Agent, or Firm—Dilworth & Barrese, LLP

(57) ABSTRACT

A DRAM array is provided capable of being interchanged between single-cell and twin-cell array operation for storing data in a single-cell or a twin-cell array format, respectively. Preferably, the DRAM array is operated in the single-cell array format during one operating mode and the DRAM array is operated in the twin-cell array format during another operating mode. Switching circuitry is included for interchanging between single-cell and twin-cell array operation, and vice versa. Methods are also provided for converting data stored within the DRAM array from the single-cell to the twin-cell array format, and vice versa.

20 Claims, 3 Drawing Sheets

DRAM ARRAY INTERCHANGEABLE BETWEEN SINGLE-CELL AND TWIN-CELL ARRAY OPERATION

FIELD OF THE INVENTION

This invention relates to the field of integrated circuit (IC) design. Specifically, it relates to a dynamic random access memory (DRAM) array interchangeable between single-cell and twin-cell array operation.

BACKGROUND OF THE INVENTION

Each memory cell in a dual-port static random access memory (SRAM) chip is a buffer or flip-flop, and data is retained as long as power is maintained to the chip. SRAMs are realized with a bipolar technology, such as TTL, ECL, or $I^2L$ or with MOS technology, such as NMOS or CMOS. Bipolar SRAMs are relatively fast, having access times of 10 to 100 nsec. Power dissipation is also high, typically, 0.1 to 1.0 mW/bit. By contrast, MOS RAM access time is typically 100 nsec and power dissipation is $25\mu$W/bit. The combination of high circuit density, low power dissipation, and reasonable access time has led to the dominance of MOS technology in the manufacture of RAM. Hence, dual-port SRAMs having high-speed buffers are widely used in devices and equipment necessitating high-speed and high performance, such as microprocessors, communication networks, facsimile machines, modems, etc.

Since the memory cells of SRAMs take up a relatively large surface area on a single integrated (IC) chip, IC design engineers, in an effort to increase the number of memory cells on the IC chip, i.e., high density, and make the chip smaller, have focused on improving dynamic RAM (DRAM) chips to make them suitable for high-speed, high performance devices and equipment. Currently, the ultimate in achieving high-density and compactness, is a DRAM chip capable of storing data in the single-cell array format where each memory cell uses a capacitor to store a charge and one transistor to gate it to sense amplifier circuits.

Nonetheless, the single-cell storage configuration does not have a low-operating voltage, does not consume low-power, does not retain data for long periods of time, and is not suitable for high-speed, high-performance applications, as compared to a DRAM chip capable of storing data in the twin-cell array format. Accordingly, it is envisioned to provide a DRAM array capable of storing data in both the single-cell and twin-cell array format, where the DRAM array is interchangeable between single-cell and twin-cell array operation.

SUMMARY

An aspect of the present invention is to provide a DRAM array capable of storing data in both the single-cell and twin-cell array format, where the DRAM array is interchangeable between single-cell and twin-cell array operation.

Another aspect of the present invention is to provide a DRAM array capable of storing data in both the single-cell and twin-cell array format, where the operating voltage of the DRAM array is reduced when the data is stored in the twin-cell array format.

Further, another aspect of the present invention is to provide a DRAM array capable of storing data in both the single-cell and twin-cell array format, where the refresh period of the DRAM array is extended when the DRAM array is operated as a twin-cell array, as compared to when the DRAM array is operated as a single-cell array.

Further still, another aspect of the present invention is to provide a DRAM array capable of storing data in both the single-cell and twin-cell array format, where data can be converted from the single-cell array format to the twin-cell array format, and vice versa.

Further, another aspect of the present invention is to provide a DRAM memory system having at least two arrays, where one array stores data in the single-cell array format and the other array stores data in the twin-cell array format, and where data stored in one array in the single-cell array format can be converted to the twin-cell array format and stored in the other array, and vice versa.

Finally, another aspect of the present invention is to provide a DRAM array capable of storing data in both the single-cell and twin-cell array format, where, during one operating mode, e.g., an active mode, the DRAM array is operated as a single-cell array, while, during another operating mode, e.g., a low-power mode, the DRAM array is operated as a twin-cell array.

Accordingly, in an embodiment of the present invention, a DRAM array is provided capable of being interchanged between single-cell and twin-cell array operation for storing data in the single-cell or the twin-cell array format, respectively. Preferably, the DRAM array is operated in the single-cell array format during one operating mode and the DRAM array is operated in the twin-cell array format during another operating mode. Switching circuitry is included for interchanging between single-cell and twin-cell array operation, and vice versa.

Methods are also provided for converting data stored within the DRAM array from the single-cell to the twin-cell array format, and vice versa. A method for converting data from a single-cell array format to a twin-cell array format comprises the steps of activating a first wordline traversing a data array; reading data stored within a first group of cells of the data array which are coupled to the first wordline to a first set of sense amplifiers; transferring data coupled to an even number of the first set of sense amplifiers to a second set of sense amplifiers; activating a second wordline traversing the data array to write the data from the second set of sense amplifiers into a second group of cells of the data array, transferring data coupled to an odd number of the first set of sense amplifiers to the second set of sense amplifiers; and activating a third wordline traversing the data array to write the data from the second set of sense amplifiers into a third group of cells of the data array.

A method for converting data from a twin-cell array format to a single-cell array format comprises the steps of activating a first wordline traversing a data array; reading data stored within a first group of cells of the data array which are coupled to the first wordline to a first set of sense amplifiers; transferring data from the first set of sense amplifiers to an odd number of sense amplifiers of a second set of sense amplifiers; activating a second wordline traversing the data array; reading data stored within a second group of cells of the data array which are coupled to the second wordline to the first set of sense amplifiers; transferring data from the first set of sense amplifiers to an even number of sense amplifiers of the second set of sense amplifiers; activating a third wordline traversing the data array; and transferring data from the second set of sense amplifiers into a third group of cells of the data array coupled to the third wordline.

DETAILED DESCRIPTION OF THE INVENTION

The present invention provides a DRAM array capable of being interchanged between single-cell and twin-cell array operation for storing data in the single-cell or the twin-cell array format, respectively. Preferably, the DRAM array is operated in the single-cell array format during one operating mode and the DRAM array is operated in the twin-cell array format during another operating mode. Methods are also provided for converting data stored within the DRAM array from the single-cell to the twin-cell array format, and vice versa.

Figure 1:
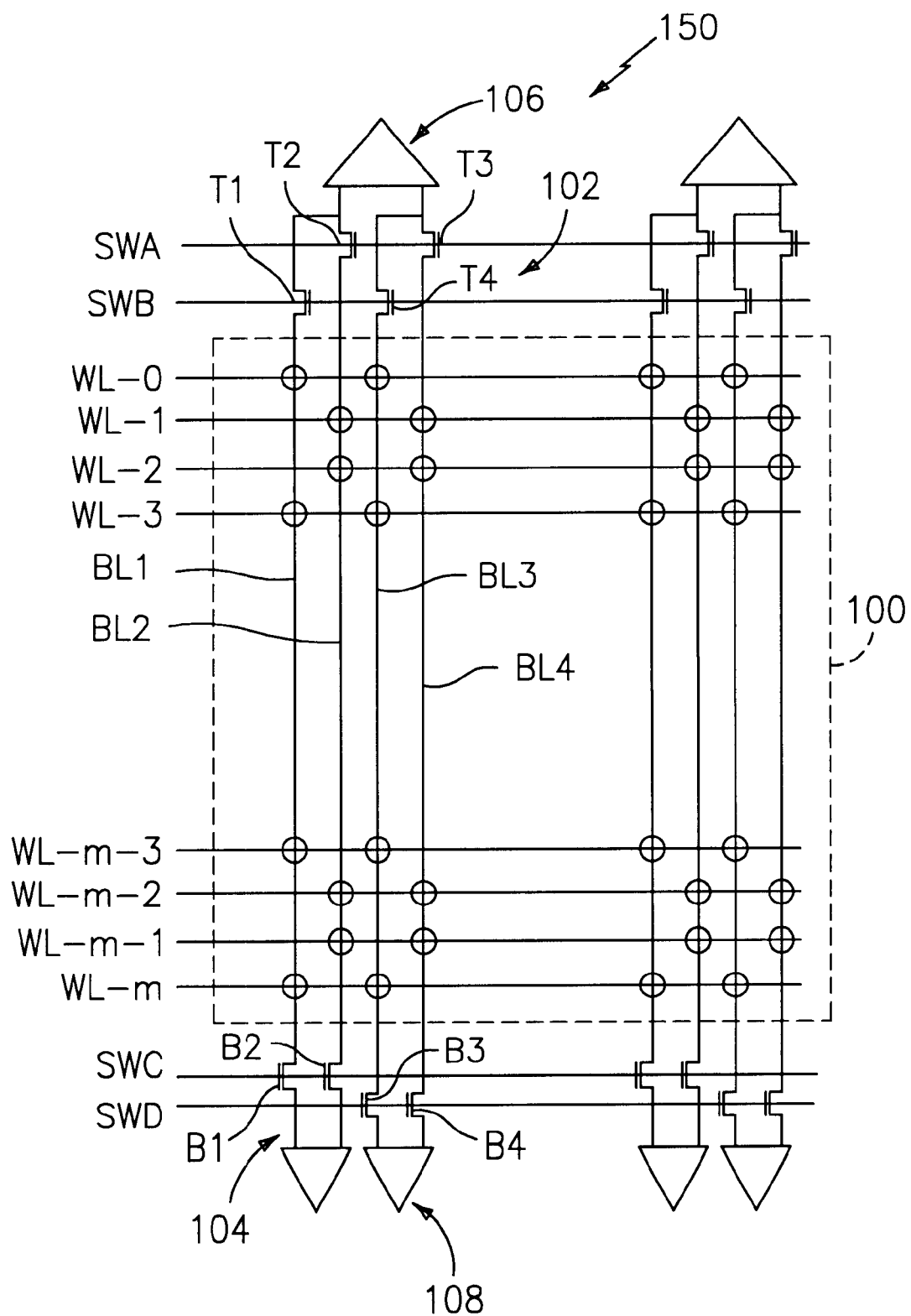
FIG. 1 is a diagram of a DRAM array capable of storing data in both the single-cell and twin-cell array format according to the present invention.

With reference to FIG. 1, there is shown a DRAM array capable of storing data in both the single-cell and twin-cell array format, where the DRAM array is interchangeable between single-cell and twin-cell array operation, according to the principles of the present invention. The DRAM array is shown as being within the dotted box and is designated generally by reference numeral 100. The DRAM array 100 includes a plurality of wordlines (WLs) and bitlines (BLs) and is similar to the conventional folded bit-line array, which is well known in the art. It is, however, contemplated that other conventional array configurations may be utilized, such as the open bit-line array.

The DRAM array 100 is part of a DRAM array system designated generally by reference numeral 150. The DRAM array system 150 includes switching circuitry having two groups of nMOS devices. For each group of four bitlines, e.g., bitlines BL1–BL4, a top switch module 102 and a bottom switch module 104 are provided. The top switch module 102 includes four switching devices, T1, T2, T3 and T4. Similarly, the bottom switch module 104 includes another four switching devices, B1, B2, B3 and B4. Preferably, the switching devices are nMOS switching devices.

The purpose of the switching devices is to read (or write) data from (or to) the DRAM array 100 during single-cell or twin-cell array operation. These switching devices can also be used to convert data from the single-cell array format into the twin-cell array format, and vice versa, as further described below. The DRAM array system further includes upper sense amplifiers 106 and lower sense amplifiers 108 connected to the bitlines and to data lines (not shown) coupled to multiplexers (not shown), as known in the art for DRAM array systems.

I. Single-Cell Array Operation

If the DRAM array 100 is operated as a single-cell array, the top switch modules 102 are shut off and only the bottom switch modules 104 are used. The switching devices B1, B2, B3 and B4 of the bottom switch modules 104 are arranged in odd and even pairs. All the odd pairs are switched by a SWC control line and all the even pairs are switched by a SWD control line. For a read or write operation, both the SWC and SWD control lines are "turned on" by providing a logic high voltage level to these lines, and hence, all the bitlines are coupled to lower sense amplifiers 108. At this moment, the DRAM array 100 and the lower sense amplifiers 108 are operated similarly to the conventional folded-bitline DRAM array system.

II. Twin-Cell Array Operation

If the DRAM array 100 is operated as a twin-cell array, all the bottom switch modules 104 are shut off, and only the top switch modules 102 are used. The switching devices T1, T2, T3 and T4 of the top switch modules 102 are arranged in odd and even pairs. All the even pairs are switched by a SWA control line and all the odd pairs are switched by a SWB control line. For a write operation, two cells are required. For example, when the wordline WL-0 is activated to write data into the two cells, the SWA control line is "turned off" by providing a logic low voltage level and the SWB control line is "turned on" by providing a logic high voltage level. Complimentary data from data lines is then fed through upper sense amplifiers 106 to all the cells that are tied to the odd bitlines. Each of the two cells are stored with two polarities of a single bit. As a further example, when writing data into the cells that are coupled to the second wordline, the SWB control line is "turned off" and the SWA control line is "turned on".

To read data during twin-cell array operation, the same procedures are followed as above with respect to performing a write operation during twin-cell array operation, but in a reverse direction. That is, for the read operation, two cells are required, but when the wordline WL-0 is activated to read data from the two cells, the SWB control line is "turned on" and the SWA control line is "turned off".

III. Data Conversion From Single-Cell to Twin-Cell Array Format

A procedure will now be described for converting data stored within the DRAM array 100 in the single-cell array format to the twin-cell array format. For example, the following procedure is used to convert data stored in the single-cell array format within single-cells coupled to the wordline WL-0 to the twin-cell array format, i.e., within twin-cells coupled to the wordlines WL-1 and WL-2.

First, data stored in the single-cells coupled to the wordline WL-0 is read and latched into the lower sense amplifiers 108 by turning control lines SWC and SWD on and turning control lines SWA and SWB off; the data from the cells of the wordline WL-0 are stored in the lower sense amplifiers 108. Second, control line SWC is kept turned on, control line SWB is turned on and control line SWD is turned off while wordline WL-1 is activated to write the odd data from the odd number lower sense amplifiers 108 into upper sense amplifiers 106 and then into cells coupled to wordline WL-1 in the twin-cell array format. Third, control lines SWB and SWC are then turned off and control lines SWA and SWD) are turned on while wordline WL-2 is activated to write data from the even number lower sense amplifiers 108 into cells coupled to upper sense amplifiers 106 and to wordline WL-2 in the twin-cell array format. It is noted that the data must be written to upper sense amplifiers 106 first, and then to the cells coupled to the targeted wordline.

One particular time that the single-cell to twin-cell conversion procedure described above is performed is just prior to or simultaneously while the DRAM array system 150 switches to an active mode. That is, prior to or simultaneously while the system 150 is switching to an active mode, data stored in the DRAM array 100 in the twin-cell array format is converted to the single-cell array format to increase the density of the system 150 during the active mode.

IV. Data Conversion From Twin-Cell to Single-Cell Array Format

A procedure will now be described for converting data stored within the DRAM array 100 in the twin-cell array format to the single-cell array format. For example, the following procedure is used to convert data stored in the twin-cell array format within the twin-cells coupled to the wordlines WL-1 and WL-2 to the single-cell array format, i.e., within single-cells coupled to the wordline WL-0.

First, data stored in the twin-cells coupled to the wordlines WL-1 are read and first latched to upper sense amplifiers 106, then latched to the odd number of the lower sense amplifiers 108 by turning control lines SWA and SWC on while wordline WL-1 is activated. Second, data stored in the twin cells coupled to wordline WL 2 are read and first latched to upper sense amplifiers 106, then latched to the even number of the lower sense amplifiers 108 by turning control lines SWA and SWD on and turning control lines SWB and SWC off while wordline WL-2 is activated. Third, control line SWC is turned on, control line SWD is kept turned on, and control lines SWA and SWB are off while wordline WL-0 is activated to write data that is latched in the lower sense amplifiers 108 to single-cells coupled to the wordline WL-0.

One particular time that the twin-cell to single-cell conversion procedure described above is performed is just prior to or simultaneously while the DRAM array system 150 switches to a low-power mode. That is, prior to or simultaneously while the system 150 is switching to a low-power mode, data stored in the DRAM array 100 in the single-cell array format is converted to the twin-cell array format. Accordingly, while the system 150 is in the low-power mode, data can be refreshed with very low-power, as is generally the case with data stored within DRAM arrays in the single-cell array format. When the DRAM array 100 is operated in the twin-cell array format, the true and complimentary data double the signal margin, thereby requiring high-power to refresh the data, as compared to when the DRAM array 100 is operated in the single-cell array format.

V. DRAM Array Systems Having Single-Cell and Twin-Cell Array Configurations

Figure 2A:
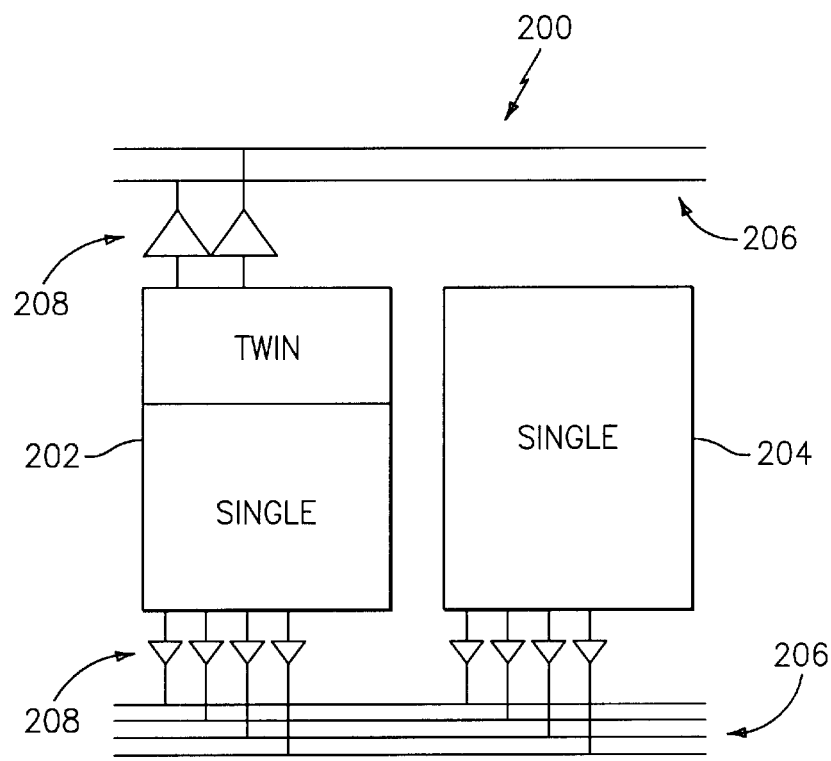
FIG. 2A is a diagram of a DRAM array system having two DRAM arrays, where one DRAM array can store data in either the single-cell or twin-cell array format and the other DRAM array can only store data in the single-cell array format.
Figure 2B:
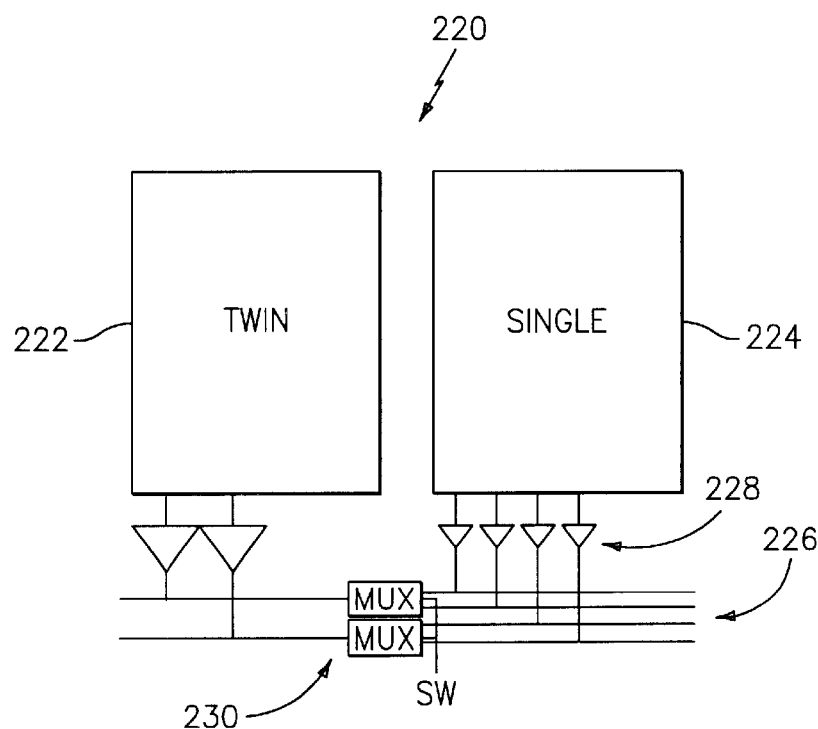
FIG. 2B is a diagram of a DRAM array system having two DRAM arrays, where one DRAM array can only store data in the single-cell array format and the other DRAM array can only store data in the twin-cell array format.
Figure 2C:
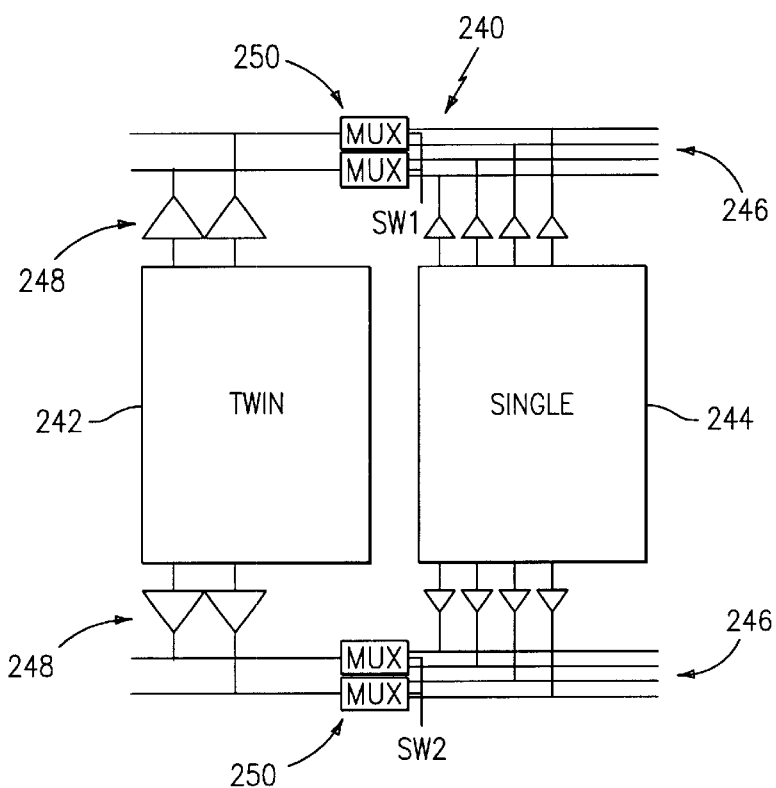
FIG. 2C is a diagram of a DRAM array system having two DRAM arrays, where one DRAM array can only store data in the single-cell array format and the other DRAM array can only store data in the twin-cell array format, and data can be converted from one format to another and transferred between the two DRAM arrays.

With reference to FIGS. 2A-2C, there are shown three exemplary DRAM array systems having single-cell and twin-cell array configurations. FIG. 2A is a diagram of a DRAM array system designated generally by reference numeral 200 having two DRAM arrays, where one DRAM array 202 can store data in either the single-cell or twin-cell array format, while another DRAM array 204 can only store data in the single-cell array format. The DRAM array system 200 also includes data lines 206 and sense amplifiers 208, as known in the art, located at the top and bottom of the DRAM array 202 and at the bottom of DRAM array 204.

FIG. 2B is a diagram of a DRAM array system designated generally by reference numeral 220 having two DRAM arrays, where one DRAM array 222 can be used to store data in the twin-cell array format, while another DRAM array 224 can be used to store data in the single-cell array format. The DRAM array system 220 also includes data lines 226, sense amplifiers 228 and multiplexers 230 controlled by a signal SW, as known in the art, located at the bottom of the DRAM arrays 222, 224.

FIG. 2C is a diagram of a DRAM array system designated generally by reference numeral 240 having two DRAM arrays, where one DRAM array 242 can only store data in the twin-cell array format and the other DRAM array 244 can only store data in the single-cell array format. The DRAM array system 240 also includes data lines 246, sense amplifiers 248 and multiplexers 250 controlled by signals SW1, SW2, as known in the art, located at the top and bottom of the DRAM arrays 242, 244. Hence, unlike the DRAM array system of FIG. 2B, in the DRAM array system 240, which is similar to the DRAM array system 150, data can be converted from either array format, according to the conversion procedures described above for the DRAM array system 150, and transferred between the two DRAM arrays 242, 244.

Figure 3:
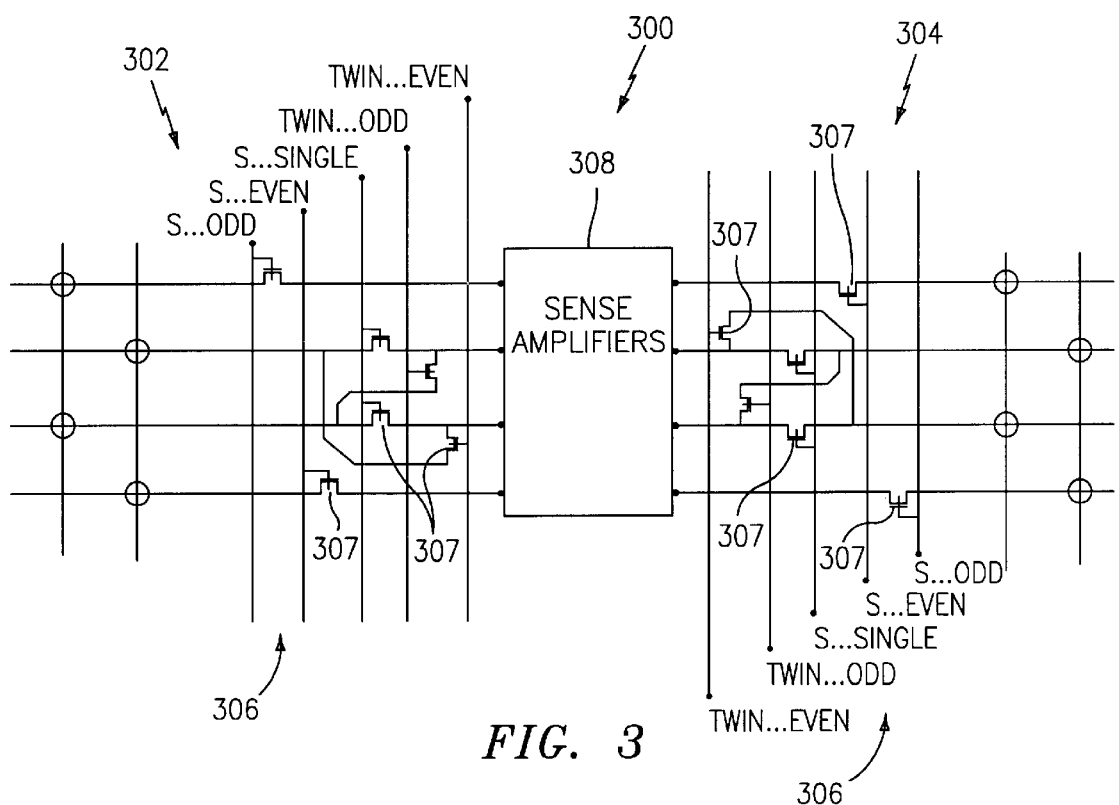
FIG. 3 is a diagram of a DRAM array having two arrays share one sense amplifier and user-selectable lines for interchanging between single-cell and twin-cell array operation.

With reference to FIG. 3, the present invention also provides a DRAM array system designated generally by reference numeral 300 where the user and/or an application can configure a left DRAM array 302 and/or a right DRAM array 304 for single-cell or twin-cell array operation by turning on and off single-cell and twin-cell selection lines 306 coupled to switching devices 307 appropriately placed within the DRAM arrays 302, 304. Each of the DRAM arrays 302, 304 includes three single-cell selection lines, i.e., S_odd, S_even and S_single, and two twin-cell selection lines, i.e., TWIN_ODD and TWIN_EVEN, to couple alternating bitlines to an active sense amplifier of a multiplexed sense amplifier bank 308 located between the left DRAM array 302 and the right DRAM array 304.

During twin-cell array operation, when the odd wordlines are active, data is sensed by a first group of alternating sense amplifiers of the multiplexed sense amplifier bank 308, and when the even wordlines are active, data is sensed by a second set of alternating sense amplifiers of the multiplexed sense amplifier bank 308. For example, for odd twin-cell array operation, the S_odd and TWIN_ODD selection lines are turned on and the S_even, S_single and TWIN_EVEN selection lines are turned off. For even twin-cell array operation, the S_even and the TWIN_EVEN selection lines are turned on and the S_odd, S_single and TWIN_ODD selection lines are turned off.

During single-cell array operation, data is sensed by all the sense amplifiers of the multiplexed sense amplifier bank 308. That is, for single-cell array operation, the S_odd, S_even and S_single selection lines are turned on and the TWIN_ODD and TWIN_EVEN selection lines are turned off.

In conclusion, the present invention provides a DRAM array system having a DRAM array capable of storing data in either the single-cell or twin-cell array format, thereby making the DRAM array suitable for high-density and low-power applications. The only additional hardware required to implement the DRAM array system of the present invention is the switch modules and the switch control circuits for turning the switches on and off. Hence, the area overhead is minimal. It is contemplated that a directory register be implemented to operate in conjunction with the DRAM array to record the status, e.g., single-cell or twin-cell, for each wordline of the DRAM array. Further, an algorithm or hardware can be implemented to perform automatic data conversion from the single-cell to the twin-cell array format, and vice versa.

What has been described herein is merely illustrative of the application of the principles of the present invention. For example, the functions described above and implemented as the best mode for operating the present invention are for illustration purposes only. As a particular example, for instance, other design configurations may be used for the single-cell and twin-cell array configurations which provide similar operation as the array configurations described above. Other arrangements and methods may be implemented by those skilled in the art without departing from the scope and spirit of this invention.

We claim:

1. A memory system comprising a plurality of dynamic random access memory (DRAM) cells arranged in an array and means for switching each of said plurality of DRAM cells between single-cell and twin-cell array operation; wherein in said single-cell array operation data is stored within said array in a single-cell array format, and in said twin-cell array operation data is stored within said array in a twin-cell array format.

2. The memory system according to claim 1, wherein said switching means includes at least two switching modules for each group of four bitlines traversing said array.

3. The memory system according to claim 2, wherein each of said at least two switching modules includes four switching devices, wherein each of said four switching devices is coupled to a respective bitline and sense amplifier.

4. The memory system according to claim 2, wherein said switching means further includes at least four control lines for controlling said at least two switching modules for switching each of said plurality of DRAM cells between said single-cell and said twin-cell array operation.

5. The memory system according to claim 1, further including means for controlling said switching means for swithing at least on of said pourality of DRAM cells between said single-cell and said twin-cell array operation.

6. The memory system according to claim 1, further including means for converting data stored within said array in said single-cell array format to data stored within said array in twin-cell array format, and vice versa.

7. A memory system comprising a plurality of dynamic random access memory (DRAM) cells arranged in a first array, a plurality of DRAM cells arranged in a second array, and means for switching each of said plurality DRAM cells in said first array between single-cell and twin-cell array operation.

8. The memory system according to claim 7, wherein said plurality of DRAM cells arranged in said second array are configured for storing data in a single-cell array format.

9. The memory system according to claim 7, wherein said plurality of DRAM cells arranged in said second array are configured for storing data in a twin-cell array format.

10. The memory system according to claim 7, further comprising means for switching each of said plurality of DRAM cells arranged in said second array between single-cell and twin-cell array operation.

11. The memory system according to claim 7, further including means for converting data stored within said first array in a single-cell array format to data stored within said first array in a twin-cell array format, and vice versa.

12. A memory system comprising a plurality of dynamic random access memory (DRAM) cells for storing data in a single-cell array format, a plurality of DRAM cells arranged in a second array for storing data in a twin-cell array format, and means for converting data stored within said first array in said single-cell array format to data stored within said second array in said twin-cell array format, and vice versa.

13. A method for processing data in a memory system comprising a plurality of dynamic random access memory (DRAM) cells arranged in an array, said method comprising the steps of
storing data within said array in a single-cell array format during a first operating mode of said memory system;
storing data within said array in a twin-cell array format during a second operating mode of said memory system; and
converting data from said single-cell array format to said twin-cell array format when said memory system is switched from said first operating mode to said second operating mode, and vice versa.

14. The method according to claim 13, further comprising the step of storing data within another array in a single-cell array format, wherein said arrays share a set of data lines.

15. A method for processing data in a memory system comprising a plurality of dynamic random access memory (DRAM) cells arranged in a first array and a plurality of DRAM cells arranged in a second array, said method comprising the steps of:
storing data within said first array in a twin-cell array format;
storing data within said second array in a single-cell array format; and
converting data within said first array in said twin-cell array format to said single-cell array format or converting data within said second array in said single-cell array format to said twin-cell array format.

16. The method according to claim 15, further comprising the step of storing data converted from said twin-cell array format to said single-cell array format within said second array or storing data converted from said single-cell array format to said twin-cell array format within said first array.

17. A method for converting data from a single-cell array format to a twin-cell array format, said method comprising the steps of:
activating a first wordline traversing a data array;
reading data stored within a first group of cells of the data array which are coupled to the first wordline to a first set of sense amplifiers;
transferring data coupled to an even number of the first set of sense amplifiers to a second set of sense amplifiers;
activating a second wordline traversing the data array to write the data from the second set of sense amplifiers into a second group of cells of the data array;
transferring data coupled to an odd number of the first set of sense amplifiers to the second set of sense amplifiers; and
activating a third wordline traversing the data array to write the data from the second set of sense amplifiers into a third group of cells of the data array.

18. A method for converting data from a twin-cell array format to a single-cell array format, said method comprising the steps of:
activating a first wordline traversing a data array;
reading data stored within a first group of cells of the data array which are coupled to the first wordline to a first set of sense amplifiers;
transferring data from the first set of sense amplifiers to an odd number of sense amplifiers of a second set of sense amplifiers;
activating a second wordline traversing the data array;
reading data stored within a second group of cells of the data array which are coupled to the second wordline to the first set of sense amplifiers;
transferring data from the first set of sense amplifiers to an even number of sense amplifiers of the second set of sense amplifiers;
activating a third wordline traversing the data array; and transferring data from the second set of sense amplifiers into a third group of cells of the data array coupled to the third wordline.

19. The method according to claim 13, wherein the step of converting data further includes the steps of:

activating a first wordline traversing the array;

reading data stored within the single-cell array coupled to the first wordline into a first set of sense amplifiers;

transferring data read by even sense amplifiers of the first set of sense amplifiers to a second set of sense amplifiers;

activating a second wordline traversing the data array;

transferring the data transferred into the second set of sense amplifiers into cells of the twin-cell array coupled to the second wordline;

transferring data read by odd sense amplifiers of the first set of sense amplifiers to a second set of sense amplifiers;

activating a third wordline traversing the data array; and transferring the data transferred into the second set of sense amplifiers into cells of the twin-cell array coupled to the third wordline.

20. The method according to claim 13, wherein the step of converting data further includes the steps of:

activating a first wordline traversing the array;

reading data stored within cells of the twin-cell array which are coupled to the first wordline to a first set of sense amplifiers;

transferring data from the first set of sense amplifiers to odd sense amplifiers of the second set of sense amplifiers;

activating a second wordline traversing the data array;

reading data stored within the cells of the twin-cell array which are coupled to the second wordline to the first set of amplifiers;

transferring data from the first set of sense amplifiers to even sense amplifiers of the second set of sense amplifiers;

activating a third wordline traversing the data array; and transferring the data from the second set of sense amplifiers into the single-cell array coupled to the third wordline.

* * * * *